US011647311B2

(12) United States Patent
Luypaert

(10) Patent No.: US 11,647,311 B2
(45) Date of Patent: May 9, 2023

(54) IMAGE SENSOR WITH DELTA SIGMA MODULATORS AND SHARED FILTERS

(71) Applicant: SEMICONDUCTOR COMPONENTS INDUSTRIES, LLC, Phoenix, AZ (US)

(72) Inventor: Carl Luypaert, Eppegem (BE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 1 day.

(21) Appl. No.: 17/248,207

(22) Filed: Jan. 14, 2021

(65) Prior Publication Data

US 2022/0224855 A1 Jul. 14, 2022

(51) Int. Cl.
*H04N 5/3745* (2011.01)
*H03M 3/00* (2006.01)
*H04N 25/772* (2023.01)

(52) U.S. Cl.
CPC .......... *H04N 25/772* (2023.01); *H03M 3/462* (2013.01)

(58) Field of Classification Search
None
See application file for complete search history.

(56) References Cited

U.S. PATENT DOCUMENTS 7,355,539 B2 4/2008 Petersen
8,081,098 B2 12/2011 Yoo
8,582,375 B2 11/2013 Baker
10,715,753 B2 * 7/2020 Kita ....................... H04N 5/378
2009/0128385 A1 5/2009 Joshi
2014/0029632 A1 * 1/2014 Alley .................... H03M 3/462 370/480
2017/0171489 A1 * 6/2017 Kobayashi ......... H04N 5/37455

OTHER PUBLICATIONS

Chong et al. "Low Power Approach for Decimation Filter Hardware Realization," World Academy of Science, Engineering and Technology (2008).

* cited by examiner

*Primary Examiner* — Mark T Monk
(74) *Attorney, Agent, or Firm* — Treyz Law Group, P.C.; Tianyi He

(57) ABSTRACT

An image sensor may include an array of image pixels arranged in rows and columns. The columns of pixels are coupled to corresponding delta sigma modulators. Each group of delta sigma modulators may be coupled to a column memory circuit. The column memory circuit may receive bits serially from each pixel column in the group. Once all bits in a bit stream from each pixel column have been stored into the column memory circuit, the column memory circuit may output one bit stream at a time to a shared filter circuit. The shared filter circuit may process an entire bit stream associated with a given column in one cycle. Sharing the filter circuit among multiple pixel columns can dramatically reduce circuit area for the image sensor.

20 Claims, 3 Drawing Sheets

42
50
52
ΔΣ
1
WORD
COLUMN MEMORY
OSR
60
DECIMATION FILTER
ENOB
38

IMAGE SENSOR WITH DELTA SIGMA MODULATORS AND SHARED FILTERS

BACKGROUND

This relates generally to imaging devices, and more particularly, to image sensors with dark reference pixels.

Image sensors are commonly used in electronic devices such as cellular telephones, cameras, and computers to capture images. In a typical arrangement, an electronic device is provided with an array of image pixels arranged in pixel rows and pixel columns. Each image pixel in the array includes a photodiode that is coupled to a floating diffusion region via a transfer gate. Row control circuitry is coupled to each pixel row for resetting, initiating charge transfer, or selectively activating a particular row of pixels for readout. Column circuitry is coupled to each pixel column for reading out pixel signals from the image pixels.

The column circuitry includes data converters such as analog-to-digital data converters each of which is connected to a respective pixel column in the array. Such types of data converters can be challenging to design. It is within this context that the embodiments described herein arise.

DETAILED DESCRIPTION

Embodiments of the present invention relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds or thousands or millions of pixels (e.g., megapixels). Image sensors may include control circuitry such as circuitry for operating the pixels and readout circuitry for reading out image signals corresponding to the electric charge generated by the photosensitive elements.

Figure 1:
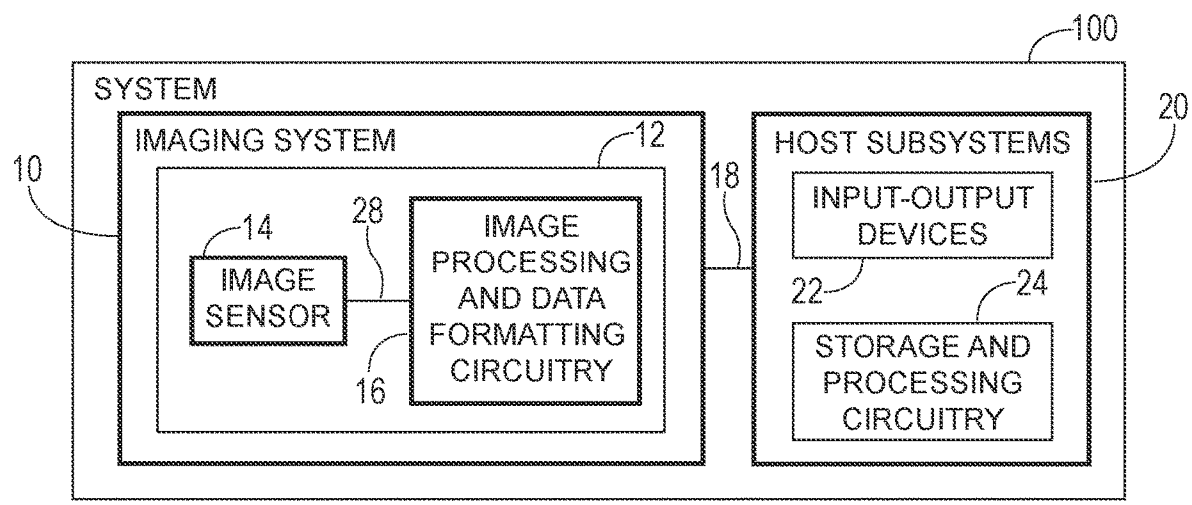
FIG. 1 is a diagram of an illustrative electronic device having an image sensor in accordance with some embodiments.

FIG. 1 is a diagram of an illustrative imaging and response system including an imaging system that uses an image sensor to capture images. System 100 of FIG. 1 may be an electronic device such as a camera, a cellular telephone, a video camera, or other electronic device that captures digital image data, may be a vehicle safety system (e.g., an active braking system or other vehicle safety system), or may be a surveillance system.

As shown in FIG. 1, system 100 may include an imaging system such as imaging system 10 and host subsystems such as host subsystem 20. Imaging system 10 may include camera module 12. Camera module 12 may include one or more image sensors 14 and one or more lenses.

Each image sensor in camera module 12 may be identical or there may be different types of image sensors in a given image sensor array integrated circuit. During image capture operations, each lens may focus light onto an associated image sensor 14. Image sensor 14 may include photosensitive elements (i.e., image sensor pixels) that convert the light into digital data. Image sensors may have any number of pixels (e.g., hundreds, thousands, millions, or more). A typical image sensor may, for example, have millions of pixels (e.g., megapixels). As examples, image sensor 14 may further include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), address circuitry, etc.

Still and video image data from camera sensor 14 may be provided to image processing and data formatting circuitry 16 via path 28. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SoC) arrangement, camera sensor 14 and image processing and data formatting circuitry 16 are implemented on a common semiconductor substrate (e.g., a common silicon image sensor integrated circuit die). If desired, camera sensor 14 and image processing circuitry 16 may be formed on separate semiconductor substrates. For example, camera sensor 14 and image processing circuitry 16 may be formed on separate substrates that have been stacked.

Imaging system 10 (e.g., image processing and data formatting circuitry 16) may convey acquired image data to host subsystem 20 over path 18. Host subsystem 20 may include processing software for detecting objects in images, detecting motion of objects between image frames, determining distances to objects in images, filtering or otherwise processing images provided by imaging system 10.

If desired, system 100 may provide a user with numerous high-level functions. In a computer or advanced cellular telephone, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

Figure 2:
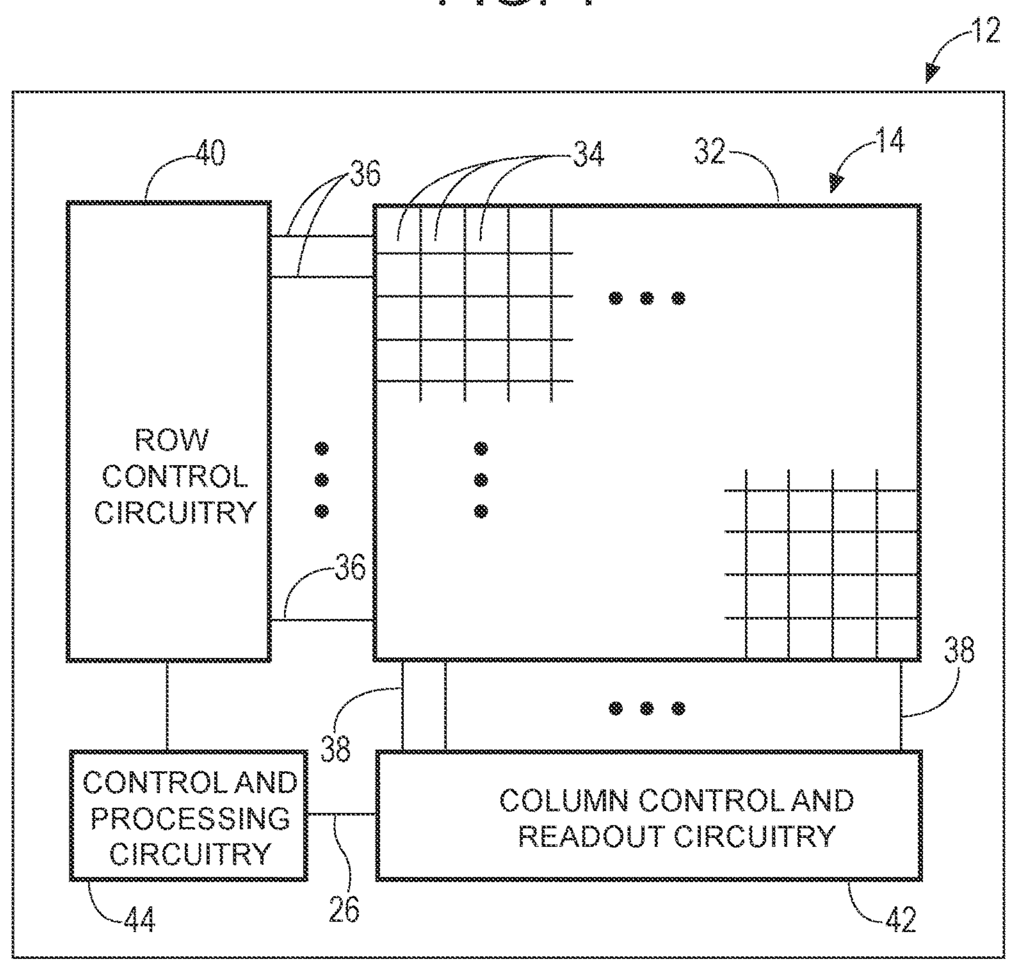
FIG. 2 is a diagram of an illustrative pixel array and associated row and column control circuitry for reading out image signals from an image sensor in accordance with some embodiments.

An example of an arrangement of image sensor 14 of FIG. 1 is shown in FIG. 2. As shown in FIG. 2, image sensor 14 may include control and processing circuitry 44. Control and processing circuitry 44 (sometimes referred to as control and processing logic) may sometimes be considered part of image processing and data formatting circuitry 16 in FIG. 1. Image sensor 14 may include a pixel array such as array 32 of pixels 34 (sometimes referred to herein as image sensor pixels, imaging pixels, or image pixels). Control and processing circuitry 44 may be coupled to row control circuitry 40 via control path 27 and may be coupled to column control and readout circuits 42 via data path 26.

Row control circuitry 40 may receive row addresses from control and processing circuitry 44 and may supply corresponding row control signals to image pixels 34 over control paths 36 (e.g., pixel reset control signals, charge transfer control signals, blooming control signals, row select control signals, dual conversion gain control signals, or any other desired pixel control signals).

Column control and readout circuitry 42 may be coupled to the columns of pixel array 32 via one or more conductive lines such as column lines 38. Column lines 38 may be coupled to each column of image pixels 34 in image pixel array 32 (e.g., each column of pixels may be coupled to a corresponding column line 38). Column lines 38 may be used for reading out image signals from image pixels 34 and for supplying bias signals (e.g., bias currents or bias voltages) to image pixels 34. During image pixel readout operations, a pixel row in image pixel array 32 may be selected using row driver circuitry 40 and image data associated with image pixels 34 of that pixel row may be read out by column readout circuitry 42 on column lines 38. Column readout circuitry 42 may include column circuitry such as column amplifiers for amplifying signals read out from array 32, sample and hold circuitry for sampling and storing signals read out from array 32, analog-to-digital converter circuits for converting read out analog signals to corresponding digital signals, and column memory for storing the read out signals and any other desired data. Column control and readout circuitry 42 may output digital pixel readout values to control and processing logic 44 over line 26.

Array 32 may have any number of rows and columns. In general, the size of array 32 and the number of rows and columns in array 32 will depend on the particular implementation of image sensor 14. While rows and columns are generally described herein as being horizontal and vertical, respectively, rows and columns may refer to any grid-like structure (e.g., features described herein as rows may be arranged vertically and features described herein as columns may be arranged horizontally).

Each pixel column line 38 may be coupled to a corresponding data converting circuit such as a delta sigma modulator. A delta sigma modulator is an analog-to-digital converter (ADC) sometimes referred to as a delta sigma converter or a sigma delta converter. A delta sigma converter typically requires decimation or filtering of a generated bit stream to achieve a useable digital output word. Thus, conventional image sensors often include delta sigma converters, each of which is connected to its own dedicated filtering stage. For large image sensors with hundreds or thousands of columns, hundreds or thousands of column filters are required, which can take up a significant amount of area on the image sensor chip.

Figure 3:
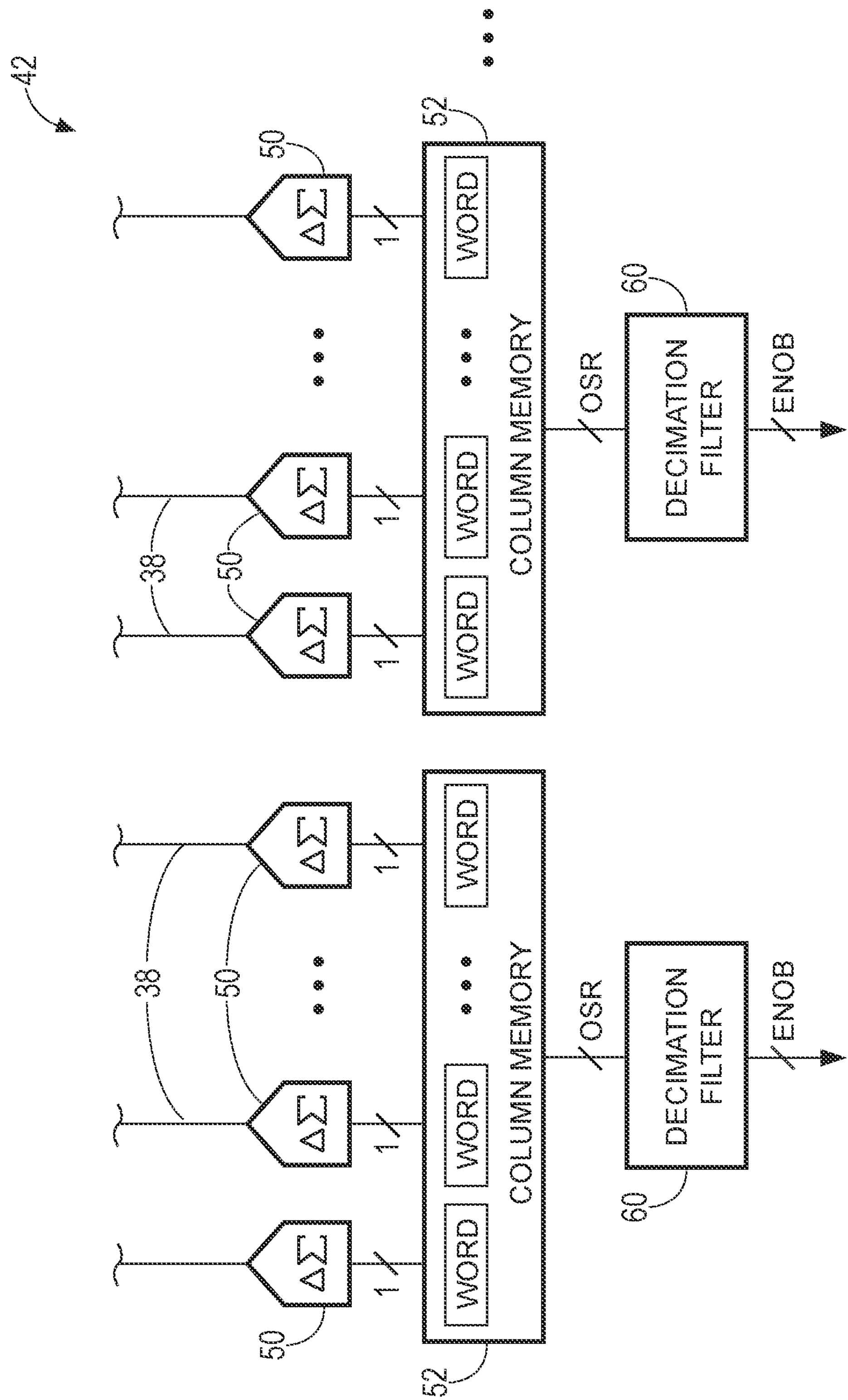
FIG. 3 is a diagram of illustrative column readout circuitry having data converters, column memory circuits, and shared decimation filters in accordance with some embodiments.

In accordance with an embodiment, bit streams generated by delta sigma converters can first be stored in column memory, which allows a filter circuit to be shared among multiple delta sigma converters. Sharing filters in this way can dramatically reduce the overall area of the column readout circuitry. FIG. 3 is a diagram of illustrative column readout circuitry having data converters, column memory circuits, and shared decimation filters. As shown in FIG. 3, column readout circuitry 42 may include delta sigma converters 50, column memory circuits 52, and filtering circuits such as decimation filters 60. Each delta sigma converter 50 may have an input port coupled to a corresponding pixel column output line 38 and an output port coupled to an input of a column memory circuit 52. Column memory circuit 52 may be a random-accessory memory (RAM) circuit such as a static RAM (SRAM), dynamic RAM (DRAM), or other types of volatile or non-volatile memory.

Multiple delta sigma converters 50 may be coupled to a single column memory circuit 52. For example, at least two delta sigma converters 50 may be coupled to a single column memory circuit 52. As another example, at least four delta sigma converters 50 may be coupled to a single column memory circuit 52. As another example, at least eight delta sigma converters 50 may be coupled to a single column memory circuit 52. As another example, two to eight delta sigma converters 50 may be coupled to a single column memory circuit 52. As another example, 8-16 delta sigma converters 50 may be coupled to a single column memory circuit 52. As another example, more than 16 delta sigma converters 50 may be coupled to a single column memory circuit 52. In general, any suitable number of delta sigma converters 50 may be coupled to a single column memory circuit 52. Moreover, column readout circuitry 42 may include any number of column memory circuits 52, each of which is configured to receive bits from the same number or a different number of data converters 50.

Each delta sigma converter 50 may output one bit at a time (see, e.g., single-bit output port of converter 50) that is serially written into column memory circuit 52. Sequential bits read out from a column line 38 can be serially written into a corresponding slot in memory circuit 52 to form a bit stream sometimes referred to collectively as a word. All of the delta sigma converters 50 associated with a common column memory circuit 52 may write serial bits into column memory circuit 52 at the same time in parallel.

Column memory circuit 52 may operate with an oversampling rate (ratio). The oversampling ratio (OSR) at which memory circuit 52 operates may be equal to 50, 60, 70, 80, 90, 10-100, 1-10, less than 50, more than 50, more than 100, or other suitable oversampling rate. If desired, the oversampling ratio may be adjusted or varied. A variable oversampling ratio can be supported by setting any unused bits in the bitstream to zero. Full bit streams output from the delta sigma converters 50 can be stored into column memory circuitry 52 before processing them using filter 60.

Once the bit stream (or word) from each pixel column has been written into column memory circuit 52, column memory circuit 52 can output all of the bits associated with one pixel column in parallel. In other words, column memory circuit 52 will process one bit stream at a time. The number of bits being output from column memory 52 to filter 60 may depend on the oversampling ratio. For example, if the OSR is equal to 70, then column memory circuit 52 may output 70 bits associated with one column word in parallel to filter 60.

Filter 60 (e.g., a decimation filter configured to reduce the sampling rate of the bitstream) may receive the oversampled bits output from column memory 52 and may generate a corresponding output having an effective number of bits (ENOB) that is less than the oversampling ratio. For example, the ENOB at the output of filter 60 may be equal to 8, 10, 12, 14, 16, 6-16, less than 12, greater than 12, 12-20, or other suitable number of bits. The bit stream can be filtered by filter 60 without the use of multiple accumulators, which avoids the need for additional storage within filter 60 (i.e., filter 60 does not include any accumulators or lacks or is completely devoid of any accumulator circuits). Filter 60 can process a full column bit stream in one cycle (e.g., only one cycle is needed to filter or decimate the word from each column).

Configured in this way, only one filter circuit 60 is shared among a group of delta sigma converters 50 coupled to the associated column memory 52. Although only two groups of converters 50 are shown in FIG. 3, column readout circuitry 42 may include any number of groups of converters 50, each of which has its own set of converters 50 coupled to a single column memory circuit 52, which is coupled to one shared decimation filter 60. Sharing and reusing one filter circuit 60 among a group of delta sigma converters 50 in this way can dramatically reduce the amount of area required for column readout circuitry 42.

Figure 4:
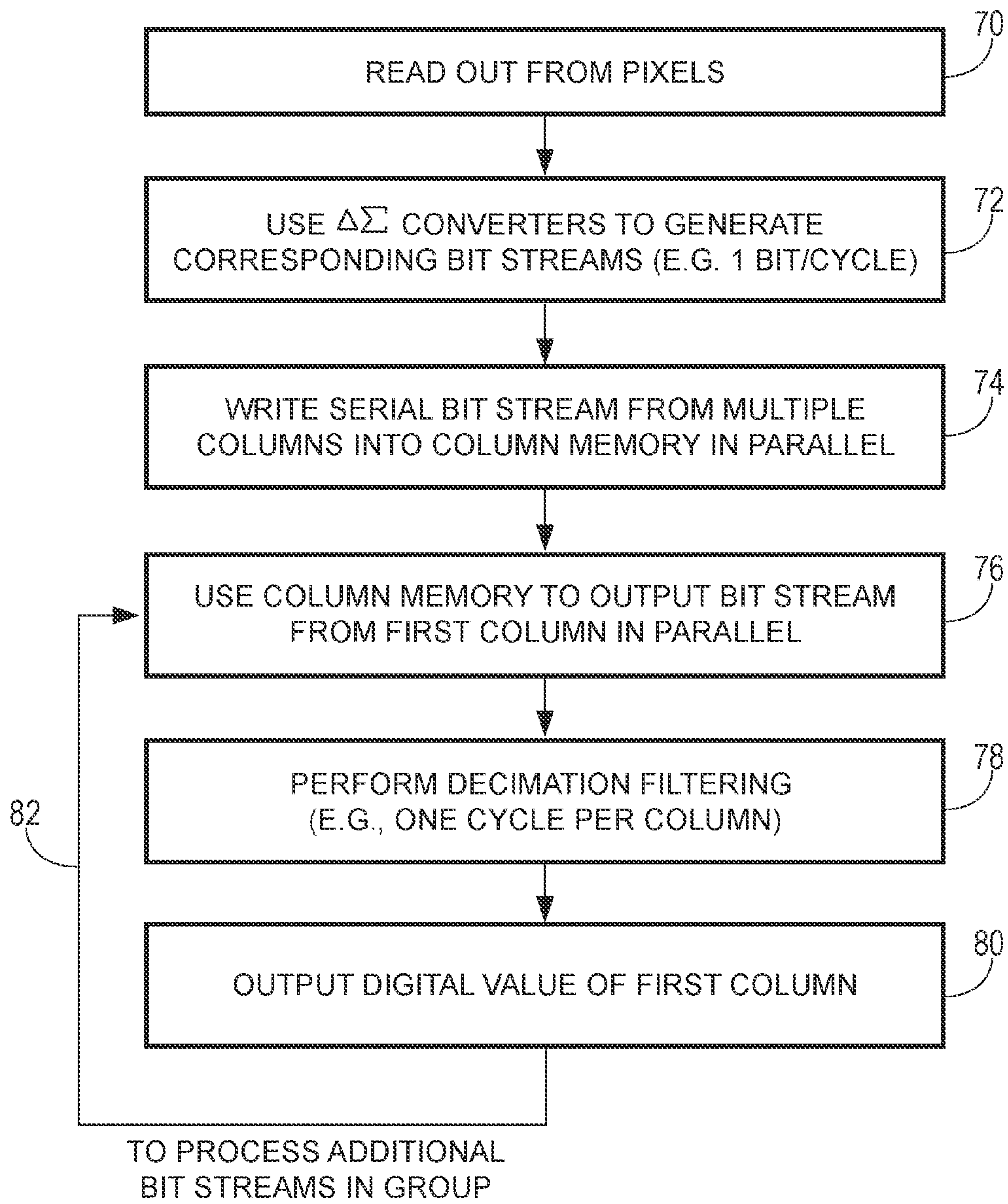
FIG. 4 is a flow chart of illustrative steps for operating the column readout circuitry shown in FIG. 3 in accordance with some embodiments.

FIG. 4 is a flow chart of illustrative steps for operating column readout circuitry 42 of the type shown in FIG. 3. At step 70, signals may be read out from the pixels in the array. For example, reset signal values or image signal values may be read out from the pixels following a reset operation or a charge transfer operation, respectively.

At step 72, the delta sigma converters may be used to generate corresponding bit streams. Each delta sigma converter may generate one bit per cycle and may therefore generate a bit stream that includes any desired number of bits over a corresponding number of cycles. For example, a bit stream (or word) that includes 72 bits may be serially stored into a corresponding column memory circuit over 72 cycles of the delta sigma converter. During the operations of step 74, the serial bit streams from all of the columns may be written into one or more column memory circuits in parallel.

At step 76, a column memory circuit may be used to output a bit stream associated with a first pixel column in parallel. At step 78, a corresponding filter circuit (e.g., a decimation filter) may be used to filter the bit stream received from the column memory. The filter can filter the bits from one pixel column per cycle (i.e., only one cycle is needed to process one column word).

At step 80, the filter circuit may output a digital value for the first column. Processing may loop back to process a bit stream for the next pixel column as indicated by path 82 until all words stored in the column memory circuit have been processed. The steps of FIG. 4 may be repeated for each row across the array of image sensor pixels.

Various embodiments are disclosed herein. In accordance with some embodiments, an image sensor is provided that includes: a first column of pixels; a second column of pixels; a first data converter configured to receive a signal from the first column of pixels; a second data converter configured to receive a signal from the second column of pixels; a column memory circuit configured to store bits generated by the first data converter and to store bits generated by the second data converter; and a filter circuit coupled to the column memory circuitry and shared among at least the first data converter and the second data converter. The first data converter can be a first delta sigma modulator configured to output one bit at a time to the column memory circuit. The second data converter can be a second delta sigma modulator configured to output one bit at a time to the column memory circuit. The column memory circuit can be configured to store a first bit stream using the bits generated by the first delta sigma modulator. The column memory circuit can be configured to store a second bit stream using the bits generated by the second delta sigma modulator. The filter circuit can be configured to receive the first bit stream during a first time period and can be configured to receive the second bit stream during a second time period different than the first time period.

In accordance with some embodiments, a method of operating an image sensor is provided that includes: reading a signal from a first column of pixels; reading a signal from a second column of pixels; receiving the signal from the first column of pixels using a first data converter; receiving the signal from the second column of pixels using a second data converter; storing serial bits output from the first data converter and storing serial bits output from the second data converter into column memory; using the column memory to output the stored bits from the first data converter in parallel to a filter circuit during a first time period and to output the stored bits from the second data converter in parallel to the filter circuit during a second time period after the first time period. The method can further include using the filter to filter the stored bits from the first delta sigma modulator in a first cycle and to filter the stored bits from the second delta sigma modulator in a second cycle following the first cycle. The filter can be decimation filter that is shared among at least the first delta sigma modulator and the second delta sigma modulator.

In accordance with some embodiments, an apparatus is provided that includes: a first pixel output line; a second pixel output line; a first analog-to-digital converter having an input coupled to the first pixel output line and having an output; a second analog-to-digital converter having an input coupled to the second pixel output line and having an output; a column memory circuit having a first input coupled to the output of the first analog-to-digital converter, a second input coupled to the output of the second analog-to-digital converter, and a parallel output; and a filter circuit having an input coupled to the parallel output and having an output on which a digital value is generated. The apparatus can further include: a third pixel output line; a fourth pixel output line; a third analog-to-digital converter having an input coupled to the third pixel output line and having an output coupled to the column memory; and a fourth analog-to-digital converter having an input coupled to the fourth pixel output line and having an output coupled to the column memory, wherein the filter circuit is shared among the first, second, third, and fourth analog-to-digital converters.

The apparatus can further include: a fifth pixel output line; a sixth pixel output line; a seventh pixel output line; an eighth pixel output line; a fifth analog-to-digital converter having an input coupled to the fifth pixel output line and having an output; a sixth analog-to-digital converter having an input coupled to the sixth pixel output line and having an output; a seventh analog-to-digital converter having an input coupled to the seventh pixel output line and having an output; an eighth analog-to-digital converter having an input coupled to the eighth pixel output line and having an output; an additional column memory circuit having a first input coupled to the output of the fifth analog-to-digital converter, a second input coupled to the output of the sixth analog-to-digital converter, a third input coupled to the output of the seventh analog-to-digital converter, a fourth input coupled to the output of the eighth analog-to-digital converter, and a parallel output; and an additional filter circuit having an input coupled to the parallel output of the additional column memory circuit.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor, comprising:

a first column of pixels;

a second column of pixels;

a first data converter configured to receive a signal from the first column of pixels;

a second data converter configured to receive a signal from the second column of pixels;

a column memory circuit configured to store bits generated by the first data converter and to store bits generated by the second data converter; and a filter circuit coupled to the column memory circuitry and shared among at least the first data converter and the second data converter.

2. The image sensor of claim 1, wherein:

the first data converter comprises a first delta sigma modulator configured to output one bit at a time to the column memory circuit;

the second data converter comprises a second delta sigma modulator configured to output one bit at a time to the column memory circuit;

the column memory circuit is configured to store a first bit stream using the bits generated by the first delta sigma modulator;

the column memory circuit is configured to store a second bit stream using the bits generated by the second delta sigma modulator;

the filter circuit is configured to receive the first bit stream during a first time period; and the filter circuit is configured to receive the second bit stream during a second time period different than the first time period.

3. The image sensor of claim 2, wherein the filter circuit comprises a decimation filter.

4. The image sensor of claim 2, wherein the filter circuit is configured to filter the first bit stream in a first cycle and to filter the second bit stream in a second cycle after the first cycle.

5. The image sensor of claim 1, further comprising:

a third column of pixels;

a four column of pixels;

a third data converter configured to receive a signal from the third column of pixels; and a fourth data converter configured to receive a signal from the fourth column of pixels, wherein the column memory circuit is also configured to store bits generated by the third data converter and to store bits generated by the fourth data converter.

6. The image sensor of claim 1, further comprising:

a third column of pixels;

a four column of pixels;

a third data converter configured to receive a signal from the third column of pixels;

a fourth data converter configured to receive a signal from the fourth column of pixels;

an additional column memory circuit configured to store bits generated by the third data converter and to store bits generated by the fourth data converter; and an additional filter circuit coupled to the additional column memory circuitry and shared among at least the third data converter and the fourth data converter.

7. The image sensor of claim 1, wherein:

the first data converter comprises a first delta sigma modulator configured to output one bit at a time to the column memory circuit; and the second data converter comprises a second delta sigma modulator configured to output one bit at a time to the column memory circuit.

8. The image sensor of claim 7, wherein:

the column memory circuit is configured to store a first bit stream using the bits generated by the first delta sigma modulator; and the column memory circuit is configured to store a second bit stream using the bits generated by the second delta sigma modulator.

9. The image sensor of claim 8, wherein:

the filter circuit is configured to receive the first bit stream during a first time period; and the filter circuit is configured to receive the second bit stream during a second time period different than the first time period.

10. The image sensor of claim 9, wherein the filter circuit comprises a decimation filter that does not include any accumulators.

11. A method of operating an image sensor, comprising:

reading a signal from a first column of pixels;

reading a signal from a second column of pixels;

with a first data converter, receiving the signal from the first column of pixels;

with a second data converter, receiving the signal from the second column of pixels;

with column memory, storing serial bits output from the first data converter and storing serial bits output from the second data converter;

with the column memory, outputting the stored bits from the first data converter in parallel to a filter circuit during a first time period; and with the column memory, outputting the stored bits from the second data converter in parallel to the filter circuit during a second time period after the first time period.

12. The method of claim 11, further comprising:

with the filter, filtering the stored bits from the first data converter in a first cycle; and with the filter, filtering the stored bits from the second data converter in a second cycle following the first cycle.

13. The method of claim 11, wherein the filter comprises a decimation filter that is shared among at least the first data converter and the second data converter.

14. The method of claim 11, wherein the first data converter comprises a first delta sigma modulator and wherein the second data converter comprises a second delta sigma modulator.

15. The method of claim 11, further comprising:

reading a signal from a third column of pixels;

reading a signal from a fourth column of pixels;

with a third data converter, receiving the signal from the third column of pixels;

with a fourth data converter, receiving the signal from the fourth column of pixels;

with the column memory, storing serial bits output from the third data converter and storing serial bits output from the fourth data converter;

with the column memory, outputting the stored bits from the third data converter in parallel to the filter circuit during a third time period after the second time period; and with the column memory, outputting the stored bits from the fourth data converter in parallel to the filter circuit during a fourth time period after the third time period.

16. An apparatus comprising:

a first pixel output line;

a second pixel output line;

a first analog-to-digital converter having an input coupled to the first pixel output line and having an output;

a second analog-to-digital converter having an input coupled to the second pixel output line and having an output;

a column memory circuit having a first input coupled to the output of the first analog-to-digital converter, a second input coupled to the output of the second analog-to-digital converter, and a parallel output; and a filter circuit having an input coupled to the parallel output and having an output on which a digital value is generated.

17. The apparatus of claim 16, further comprising:

a third pixel output line;

a fourth pixel output line;

a third analog-to-digital converter having an input coupled to the third pixel output line and having an output coupled to the column memory; and a fourth analog-to-digital converter having an input coupled to the fourth pixel output line and having an output coupled to the column memory, wherein the filter circuit is shared among the first, second, third, and fourth analog-to-digital converters.

18. The apparatus of claim 17, wherein the first, second, third, and fourth analog-to-digital converters comprises delta sigma modulators.

19. The apparatus of claim 18, wherein the filter circuit comprises a decimation filter that lacks an accumulator.

20. The apparatus of claim 17, further comprising:

a fifth pixel output line;

a sixth pixel output line;

a seventh pixel output line;

an eighth pixel output line;

a fifth analog-to-digital converter having an input coupled to the fifth pixel output line and having an output;

a sixth analog-to-digital converter having an input coupled to the sixth pixel output line and having an output;

a seventh analog-to-digital converter having an input coupled to the seventh pixel output line and having an output;

an eighth analog-to-digital converter having an input coupled to the eighth pixel output line and having an output;

an additional column memory circuit having a first input coupled to the output of the fifth analog-to-digital converter, a second input coupled to the output of the sixth analog-to-digital converter, a third input coupled to the output of the seventh analog-to-digital converter, a fourth input coupled to the output of the eighth analog-to-digital converter, and a parallel output; and an additional filter circuit having an input coupled to the parallel output of the additional column memory circuit.

* * * * *